United States Patent
Villemoes

(10) Patent No.: US 11,817,110 B2
(45) Date of Patent: *Nov. 14, 2023

(54) CROSS PRODUCT ENHANCED SUBBAND BLOCK BASED HARMONIC TRANSPOSITION

(71) Applicant: DOLBY INTERNATIONAL AB, Amsterdam (NL)

(72) Inventor: Lars Villemoes, Järfälla (SE)

(73) Assignee: DOLBY INTERNATIONAL AB, Dublin (IE)

( * ) Notice: Subject to any disclaimer, the term of this patent is extended or adjusted under 35 U.S.C. 154(b) by 62 days.

This patent is subject to a terminal disclaimer.

(21) Appl. No.: 17/829,733

(22) Filed: Jun. 1, 2022

(65) Prior Publication Data

US 2022/0293113 A1   Sep. 15, 2022

Related U.S. Application Data

(63) Continuation of application No. 16/917,171, filed on Jun. 30, 2020, now Pat. No. 11,355,133, which is a
(Continued)

(51) Int. Cl.
*G10L 19/02* (2013.01)
*G10L 21/038* (2013.01)
*G10L 21/04* (2013.01)
*G10L 19/025* (2013.01)
*G10L 19/26* (2013.01)
(Continued)

(52) U.S. Cl.
CPC ........ *G10L 19/0208* (2013.01); *G10L 19/025* (2013.01); *G10L 19/265* (2013.01);
(Continued)

(58) Field of Classification Search
CPC . G10L 19/0208; G10L 19/025; G10L 19/265; G10L 21/038; G10L 21/04; H03G 3/00; H03G 3/3089
See application file for complete search history.

(56) References Cited

U.S. PATENT DOCUMENTS 5,890,108 A   3/1999   Yeldener
8,818,541 B2   8/2014   Villemoes
(Continued)

FOREIGN PATENT DOCUMENTS

CN   1315033   9/2001
CN   1606687   4/2005
(Continued)

OTHER PUBLICATIONS

Huan Zhou et al. "Finalization of CE on OMF Based Harmonic Transposer" MPEG meeting Jul. 26-30, 2010.
(Continued)

*Primary Examiner* — Sonia L Gay

(57) ABSTRACT

The invention provides an efficient implementation of cross-product enhanced high-frequency reconstruction (HFR), wherein a new component at frequency $Q\Omega+r\Omega_0$ is generated on the basis of existing components at $\Omega$ and $\Omega+\Omega_0$. The invention provides a block-based harmonic transposition, wherein a time block of complex subband samples is processed with a common phase modification. Superposition of several modified samples has the net effect of limiting undesirable intermodulation products, thereby enabling a coarser frequency resolution and/or lower degree of oversampling to be used. In one embodiment, the invention further includes a window function suitable for use with block-based cross-product enhanced HFR. A hardware embodiment of the invention may include an analysis filter bank, a subband processing unit configurable by control data and a synthesis filter bank.

3 Claims, 5 Drawing Sheets

Related U.S. Application Data continuation of application No. 16/545,359, filed on Aug. 20, 2019, now Pat. No. 10,706,863, which is a continuation of application No. 16/211,563, filed on Dec. 6, 2018, now Pat. No. 10,446,161, which is a continuation of application No. 15/904,702, filed on Feb. 26, 2018, now Pat. No. 10,192,562, which is a continuation of application No. 15/480,859, filed on Apr. 6, 2017, now Pat. No. 9,940,941, which is a continuation of application No. 14/854,498, filed on Sep. 15, 2015, now Pat. No. 9,735,750, which is a continuation of application No. 13/822,601, filed as application No. PCT/EP2011/065318 on Sep. 5, 2011, now Pat. No. 9,172,342.

(60) Provisional application No. 61/419,164, filed on Dec. 2, 2010, provisional application No. 61/383,441, filed on Sep. 16, 2010.

(51) Int. Cl.
  *H03G 3/00* (2006.01)
  *H03G 3/30* (2006.01)

(52) U.S. Cl.
  CPC ............ *G10L 21/038* (2013.01); *G10L 21/04* (2013.01); *H03G 3/00* (2013.01); *H03G 3/3089* (2013.01)

(56) References Cited

U.S. PATENT DOCUMENTS

| | | |
|---|---|---|
| 2005/0165611 A1 | 7/2005 | Mehrotra |
| 2007/0078645 A1 | 4/2007 | Niemisto |
| 2008/0046237 A1 | 2/2008 | Zopf |
| 2008/0052068 A1 | 2/2008 | Aguilar |
| 2009/0299756 A1 | 12/2009 | Davis |
| 2012/0278088 A1 | 11/2012 | Villemoes |
| 2013/0051571 A1 | 2/2013 | Nagel |

FOREIGN PATENT DOCUMENTS

| | | |
|---|---|---|
| EA | 001087 | 10/2000 |
| EP | 01367566 A2 | 12/2003 |
| EP | 2104096 | 9/2009 |
| JP | 2001127641 | 5/2001 |
| JP | 2003258647 | 9/2003 |
| JP | 2005173607 | 6/2005 |
| JP | 2007316254 | 12/2007 |
| JP | 2008537606 A | 9/2008 |
| RU | 2262748 | 10/2005 |
| RU | 2302665 | 7/2007 |
| RU | 2374703 C2 | 11/2009 |
| RU | 2386179 C2 | 4/2010 |
| RU | 2390856 | 5/2010 |
| WO | 9857436 | 12/1998 |
| WO | 0241301 | 5/2002 |
| WO | 2004097794 | 11/2004 |
| WO | 2007085275 | 8/2007 |
| WO | 2009124926 | 10/2009 |
| WO | 2010003557 | 1/2010 |
| WO | 2010086194 | 8/2010 |
| WO | 2010086461 | 8/2010 |
| WO | 2010081892 | 11/2010 |

OTHER PUBLICATIONS

Zhong Haishan et al. "QMF Based Harmonic Spectral Band Replication" AES 131st Convention, Oct. 23, 2011, pp. 1-9, New York, USA.

US 11,817,110 B2

CROSS PRODUCT ENHANCED SUBBAND BLOCK BASED HARMONIC TRANSPOSITION

CROSS REFERENCE TO RELATED APPLICATIONS

This application is continuation of U.S. application Ser. No. 16/917,171, filed on Jun. 30, 2020, which is continuation of U.S. application Ser. No. 16/545,359, filed on Aug. 20, 2019, now U.S. Pat. No. 10,706,863, issued on Jul. 7, 2020, which is continuation of U.S. application Ser. No. 16/211,563, filed on Dec. 6, 2018, now U.S. Pat. No. 10,446,161, issued on Oct. 15, 2019, which is continuation of U.S. patent application Ser. No. 15/904,702, filed on Feb. 26, 2018, now U.S. Pat. No. 10,192,562, issued on Jan. 29, 2019, which is continuation of U.S. patent application Ser. No. 15/480,859, filed on Apr. 6, 2017, now U.S. Pat. No. 9,940,941, issued on Apr. 10, 2018, which is continuation of U.S. patent application Ser. No. 14/854,498, filed on Sep. 15, 2015, now U.S. Pat. No. 9,735,750, issued on Aug. 15, 2017, which is continuation of U.S. patent application Ser. No. 13/822,601, filed on Mar. 12, 2013, now U.S. Pat. No. 9,172,342, issued on Oct. 27, 2015, which is the United States National Entry of International Patent Application No. PCT/EP2011/065318, filed on Sep. 5, 2011, which claims the benefit of U.S. Provisional Application Nos. 61/419,164, and 61/383,441, filed on Dec. 2, 2010 and Sep. 16, 2010, respectively. Each of the listed applications is hereby incorporated by reference in its entirety.

TECHNICAL FIELD

The present invention relates to audio source coding systems which make use of a harmonic transposition method for high-frequency reconstruction (HFR), to digital effect processors, such as exciters which generate harmonic distortion to add brightness to a processed signal, and to time stretchers which prolong a signal duration with maintained spectral content.

BACKGROUND OF THE INVENTION

In WO 98/57436 the concept of transposition was established as a method to recreate a high frequency band from a lower frequency band of an audio signal. A substantial saving in bitrate can be obtained by using this concept in audio coding. In an HFR based audio coding system, a low bandwidth signal is presented to a core waveform coder and the higher frequencies are regenerated using transposition and additional side information of very low bitrate describing the target spectral shape at the decoder side. For low bitrates, where the bandwidth of the core coded signal is narrow, it becomes increasingly important to recreate a high band with perceptually pleasant characteristics. The harmonic transposition defined in WO98/57436 performs very well for complex musical material in a situation with low cross over frequency. The principle of a harmonic transposition is that a sinusoid with frequency $\omega$ is mapped to a sinusoid with frequency $Q_\varphi \omega$ where $Q_\varphi > 1$ is an integer defining the order of the transposition. In contrast to this, a single sideband modulation (SSB) based HFR maps a sinusoid with frequency $\omega$ to a sinusoid with frequency $\omega + \Delta\omega$ where $\Delta\omega$ is a fixed frequency shift. Given a core signal with low bandwidth, a dissonant ringing artifact will result from the SSB transposition.

In order to reach the best possible audio quality, state of the art high quality harmonic HFR methods employ complex modulated filter banks with very fine frequency resolution and a high degree of oversampling to reach the required audio quality. The fine resolution is necessary to avoid unwanted intermodulation distortion arising from the nonlinear treatment of sums of sinusoids. With sufficiently narrow subbands, the high quality methods aim at having at most one sinusoid in each subband. A high degree of oversampling in time is necessary to avoid alias type distortion, and a certain degree of oversampling in frequency is necessary to avoid pre-echoes for transient signals. The obvious drawback is that the computational complexity becomes very high.

Another common drawback associated with harmonic transposers becomes apparent for signals with a prominent periodic structure. Such signals are superimpositions of harmonically related sinusoids with frequencies $\Omega$, $2\Omega$, $3\Omega$, ..., where $\Omega$ is the fundamental frequency. Upon harmonic transposition of order $Q_\varphi$, the output sinusoids have frequencies $Q_\varphi \Omega$, $2Q_\varphi \Omega$, $3Q_\varphi \Omega$, ..., which, in case of $Q_\varphi > 1$, is only a strict subset of the desired full harmonic series. In terms of resulting audio quality a "ghost" pitch corresponding to the transposed fundamental frequency $Q_\varphi \Omega$ will typically be perceived. Often the harmonic transposition results in a "metallic" sounding character of the encoded and decoded audio signal.

In WO2010/081892, which is incorporated herein by reference, the method of cross products was developed to address the above ghost pitch problem in the case of high quality transposition. Given partial or transmitted full information on the fundamental frequency value of the dominating harmonic part of the signal to be transposed with higher fidelity, the nonlinear subband modifications are supplemented with nonlinear combinations of at least two different analysis subbands, where the distances between the analysis subband indices are related to the fundamental frequency. The result is to regenerate the missing partials in the transposed output, which however happens at a considerable computational cost.

SUMMARY OF THE INVENTION

In view of the above shortcomings of available HFR methods, it is an object of the present invention to provide a more efficient implementation of cross-product enhanced HFR. In particular, it is an object to provide such a method enabling a high-fidelity audio reproduction at a reduced computational effort compared to available techniques.

The present invention achieves at least one of these objects by providing devices and methods as set forth in the independent claims.

In a first aspect, the invention provides a system configured to generate a time stretched and/or frequency transposed signal from an input signal. The system comprises:
  an analysis filter bank configured to derive a number Y of analysis subband signals from the input signal, wherein each analysis subband signal comprises a plurality of complex-valued analysis samples, each having a phase and a magnitude;
  a subband processing unit configured to determine a synthesis subband signal from the Y analysis subband signals using a subband transposition factor Q and a subband stretch factor S, at least one of Q and S being greater than one, wherein the subband processing unit comprises:

a block extractor configured to:
  i) form Y frames of L input samples, each frame being extracted from said plurality of complex-valued analysis samples in an analysis subband signal and the frame length being L>1; and
  ii) apply a block hop size of h samples to said plurality of analysis samples, prior to forming a subsequent frame of L input samples, thereby generating a sequence of frames of input samples;
a nonlinear frame processing unit configured to generate, on the basis of Y corresponding frames of input samples formed by the block extactor, a frame of processed samples by determining a phase and magnitude for each processed sample of the frame, wherein, for at least one processed sample:
  i) the phase of the processed sample is based on the respective phases of the corresponding input sample in each of the Y frames of input samples; and
  ii) the magnitude of the processed sample is based on the magnitude of the corresponding input sample in each of the Y frames of input samples; and
an overlap and add unit configured to determine the synthesis subband signal by overlapping and adding the samples of a sequence of frames of processed samples; and
a synthesis filter bank configured to generate the time stretched and/or frequency transposed signal from the synthesis subband signal.

The system may be operable for any positive integer value of Y. However, it is operable at least for Y=2.

In a second aspect the invention provides method for generating a time-stretched and/or frequency-transposed signal from an input signal. The method comprises:
deriving a number Y≥2 of analysis subband signals from the input signal, wherein each analysis subband signal comprises a plurality of complex-valued analysis samples, each having a phase and a magnitude;
forming Y frames of L input samples, each frame being extracted from said plurality of complex-valued analysis samples in an analysis subband signal and the frame length being L>1;
applying a block hop size of h samples to said plurality of analysis samples, prior to deriving a subsequent frame of L input samples, thereby generating a sequence of frames of input samples;
generating, on the basis of Y corresponding frames of input samples, a frame of processed samples by determining a phase and a magnitude for each processed sample of the frame, wherein, for at least one processed sample:
  the phase of the processed sample is based on the respective phases of the corresponding input sample in at least one of the Y frames of input samples; and
  the magnitude of the processed sample is based on the magnitude of the corresponding input sample in each of the Y frames of input samples;
determining the synthesis subband signal by overlapping and adding the samples of a sequence of frames of processed samples; and
generating the time stretched and/or frequency transposed signal from the synthesis subband signal.

Here, Y is an arbitrary integer greater than one. The system according to the first aspect is operable to carry out the method at least for Y=2.

A third aspect of the invention provides a computer program product including a computer readable medium (or data carrier) storing software instructions for causing a programmable computer to execute the method according to the second aspect.

The invention is based on the realization that the general concept of cross-product enhanced HFR will provide improved results when the data are processed arranged in blocks of complex subband samples. Inter alia, this makes it possible to apply a frame-wise phase offset to the samples, which has been found to reduce intermodulation products in some situations. It is further possible to apply a magnitude adjustment, which may lead to similar advantageous effects. The inventive implementation of cross-product enhanced HFR includes subband block based harmonic transposition, which may significantly reduce intermodulation products. Hence, a filter bank with a coarser frequency resolution and/or a lower degree of oversampling (such as a QMF filter bank) can be used while preserving a high output quality. In subband block based processing, a time block of complex subband samples is processed with a common phase modification, and the superposition of several modified samples to form an output subband sample has the net effect of suppressing intermodulation products which would otherwise occur when the input subband signal consists of several sinusoids. Transposition based on block based subband processing has much lower computational complexity than high-resolution transposers and reaches almost the same quality for many signals.

For the purpose of this disclosure, it is noted that in embodiments where Y≥2, the non-linear processing unit uses as input Y "corresponding" frames of input samples in the sense that the frames are synchronous or near synchronous. E.g., the samples in the respective frames may relate to time intervals having a substantial time overlap between the frames. The term "corresponding" is also used with respect to samples to indicate that these are synchronous or approximately so. Further, the term "frame" will be used interchangeably with "block". Consequently, the "block hop size" may be equal to the frame length (possibly adjusted with respect to downsampling if such is applied) or may be smaller than the frame length (possibly adjusted with respect to downsampling if such is applied), in which case consecutive frames overlap in the sense that an input sample may belong to more than one frame. The system does not necessarily generate every processed sample in a frame by determining its phase and magnitude based on the phase and magnitude of all Y corresponding frames of input samples; without departing from the invention, the system may generate the phase and/or magnitude of some processed samples based on a smaller number of corresponding input samples, or based on one input sample only.

In one embodiment, the analysis filter bank is a quadrature mirror filter (QMF) bank or pseudo-QMF bank with any number of taps and points. It may for instance be a 64-point QMF bank. The analysis filter bank may further be chosen from the class of windowed discrete Fourier transforms or a wavelet transforms. Advantageously, the synthesis filter bank matches the analysis filter bank by being, respectively, an inverse QMF bank, an inverse pseudo-QMF bank etc. It is known that such filter banks may have a relatively coarse frequency resolution and/or a relatively low degree of oversampling. Unlike the prior art, the invention may be embodied using such relatively simpler components without necessarily suffering from a decreased output quality; hence such embodiments represent an economic advantage over the prior art.

In one embodiment, one or more of the following is true of the analysis filter bank:

an analysis time stride is $\Delta t_A$;
an analysis frequency spacing is $\Delta f_A$;
the analysis filter bank includes N>1 analysis subbands indexed by an analysis subband index n=0, ..., N−1;
an analysis subband is associated with a frequency band of the input signal.

In one embodiment, one or more of the following is true of the synthesis filter bank:
a synthesis time stride is $\Delta t_S$;
a synthesis frequency spacing is $\Delta f_S$;
the synthesis filter bank includes M>1 synthesis subbands indexed by a synthesis subband index m=0, ..., M−1;
a synthesis subband is associated with a frequency band of the time-stretched and/or frequency-transposed signal.

In one embodiment, the nonlinear frame processing unit is adapted to input two frames (Y=2) in order to generate one frame of processed samples, and the subband processing unit includes a cross processing control unit for generating cross processing control data. By thereby specifying the quantitative and/or qualitative characteristics of the subband processing, the invention achieves flexibility and adaptability. The control data may specify subbands (e.g., identified by indices) that differ in frequency by a fundamental frequency of the input signal. In other words, the indices identifying the subbands may differ by an integer approximating the ratio of such fundamental frequency divided by the analysis frequency spacing. This will lead to a psycho-acoustically pleasing output, as the new spectral components generated by the harmonic transposition will be compatible with the series of natural harmonics.

In a further development of the preceding embodiment, the (input) analysis and (output) synthesis subband indices are chosen so as to satisfy equation (16) below. A parameter σ appearing in this equation makes it applicable to both oddly and evenly stacked filter banks. When subband indices obtained as an approximate (e.g., least squares) solution to equation (16), the new spectral component obtained by harmonic transposition will be likely to be compatible with the series of natural harmonics. Hence, the HFR will be likely to provide a faithful reconstruction of an original signal which has had its high-frequency content removed.

A further development of the preceding embodiment provides a way of selecting parameter r appearing in equation (16) and representing the order of the cross-product transposition. Given an output subband index m, each value of the transposition order r will determine two analysis subband indices $n_1$, $n_2$. This further development assesses the magnitudes of the two subbands for a number of r options and selects that value which maximizes the minimum of the two analysis subband magnitudes. This way of selecting indices may avoid the need to restore sufficient magnitude by amplifying weak components of the input signal, which may lead to poor output quality. In this connection, the subband magnitudes may be computed in a manner per se known, such as by the square root of squared input samples forming a frame (block) or part of a frame. A subband magnitude may also be computed as a magnitude of a central or near-central sample in a frame. Such a computation may provide a simple yet adequate magnitude measure.

In a further development of the preceding embodiment, a synthesis subband may receive contributions from harmonic transposition instances according to both direct processing and cross-product based processing. In this connection, decision criteria may be applied to determine whether a particular possibility of regenerating a missing partial by cross-product based processing is to be used or not. For instance, this further development may be adapted to refrain from using one cross subband processing unit if one of the following conditions is fulfilled:
a) the ratio of the magnitude $M_S$ of the direct source term analysis subband yielding the synthesis subband and the least magnitude $M_C$ in an optimal pair of cross source terms yielding the synthesis subband is greater than a predetermined constant;
b) the synthesis subband already receives a significant contribution from a direct processing unit;
c) a fundamental frequency $\Omega_0$ is smaller than the analysis filter bank spacing $\Delta f_A$.

In one embodiment, the invention includes downsampling (decimation) of the input signal. Indeed, one or more of the frames of input samples may be determined by downsampling the complex-valued analysis samples in a subband, as may be effected by the block extractor.

In a further development of the preceding embodiment, the downsampling factors to be applied satisfy equation (15) below. Not both downsampling factors are allowed to be zero, as this corresponds to a trivial case. Equation (15) defines a relationship between the downsampling factors $D_1$, $D_2$ with the subband stretch factor S and the subband transposition factor Q, and further with phase coefficients $T_1$, $T_2$ appearing in an expression (13) for determining the phase of a processed sample. This ensures a matching of the phase of the processed samples with the other components of the input signal, to which the processed samples are to be added.

In one embodiment, the frames of processed samples are windowed before they are overlapped and added together. A windowing unit may be adapted to apply a finite-length window function to frames of processed samples. Suitable window functions are enumerated in the appended claims.

The inventor has realized that cross-product methods of the type disclosed in WO 2010/081892 are not entirely compatible with subband block based processing techniques from the outset. Although such a method may be satisfactorily applied to one of the subband samples in a block, it might lead to aliasing artifacts if it were extended in the straightforward manner to the other samples of the block. To this end, one embodiment applies window functions comprising window samples which add up—when weighted by complex weights and shifted by a hop size—to a substantially constant sequence. The hop size may be the product of the block hop size h and the subband stretch factor S. The use of such window functions reduces the impact of aliasing artifacts. Alternatively or additionally, such window functions may also allow for other measures for reducing artifacts, such as phase rotations of processed samples.

Preferably, consecutive complex weights, which are applied for assessing the condition on the window samples, differ only by a fixed phase rotation. Further preferably, said fixed phase rotation is proportional to a fundamental frequency of the input signal. The phase rotation may also be proportional to the order of the cross-product transposition to be applied and/or to the physical transposition parameter and/or to the difference of the downsampling factors and/or to the analysis time stride. The phase rotation may be given by equation (21), at least in an approximate sense.

In one embodiment, the present invention enables cross-product enhanced harmonic transposition by modifying the synthesis windowing in response to a fundamental frequency parameter.

In one embodiment, successive frames of processed samples are added with a certain overlap. To achieve the suitable overlap, the frames of processed frames are suitably shifted by a hop size which is the block hop size h upscaled by the subband stretch factor S. Hence, if the overlap of consecutive frames of input samples is L−h, then the overlap of consecutive frames of processed samples may be S(L−h).

In one embodiment, the system according to the invention is operable not only to generate a processed sample on the basis of Y=2 input samples, but also on the basis of Y=1 sample only. Hence, the system may regenerate missing partials not only by a cross-product based approach (such as by equation (13)) but also by a direct subband approach (such as by equation (5) or (11)). Preferably, a control unit is configured to control the operation of the system, including which approach is to be used to regenerate a particular missing partial.

In a further development of the preceding embodiment, the system is further adapted to generate a processed sample on the basis of more than three samples, i.e., for Y≥3. For instance, a processed sample may be obtained by multiple instances of cross-product based harmonic transposition may contribute to a processed sample, by multiple instances of direct subband processing, or by a combination of cross-product transposition and direct transposition. This option of adapting the transposition method provides for a powerful and versatile HFR. Consequently, this embodiment is operable to carry out the method according to the second aspect of the invention for Y=3, 4, 5 etc.

One embodiment is configured to determine a processed sample as a complex number having a magnitude which is a mean value of the respective magnitudes of corresponding input samples. The mean value may be a (weighted) arithmetic, (weighted) geometric or (weighted) harmonic mean of two or more input samples. In the case Y=2, the mean is based on two complex input samples. Preferably, the magnitude of the processed sample is a weighted geometric value. More preferably, the geometric value is weighted by parameters $\rho$ and $1-\rho$, as in equation (13). Here, the geometrical magnitude weighting parameter $\rho$ is a real number inversely proportional to the subband transposition factor Q. The parameter $\rho$ may further be inversely proportional to the stretch factor S.

In one embodiment, the system is adapted to determine a processed sample as a complex number having a phase which is a linear combination of respective phases of corresponding input samples in the frames of input samples. In particular, the linear combination may comprise phases relating to two input samples (Y=2). The linear combination of two phases may apply integer non-zero coefficients, the sum of which is equal to the stretch factor S multiplied by the subband transposition factor Q. Optionally, the phase obtained by such linear combination is further adjusted by a fixed phase correction parameter. The phase of the processed sample may be given by equation (13).

In one embodiment, the block extractor (or an analogous step in a method according to the invention) is adapted to interpolate two or more analysis samples from an analysis subband signal in order to obtain one input sample which will be included in a frame (block). Such interpolation may enable downmixing of the input signal by a non-integer factor. The analysis samples to be interpolated may or may not be consecutive.

In one embodiment, the configuration of the subband processing may be controlled by control data provided from outside the unit effecting the processing. The control data may relate to momentary acoustic properties of the input signal. For instance, the system itself may include a section adapted to determine momentary acoustic properties of the signal, such as the (dominant) fundamental frequency of the signal. Knowledge of the fundamental frequency provides a guidance in selecting the analysis subbands from which the processed samples are to be derived. Suitably, the spacing of the analysis subbands is proportional to such fundamental frequency of the input signal. As an alternative, the control data may also be provided from outside the system, preferably by being included in a coding format suitable for transmission as a bit stream over a digital communication network. In addition to the control data, such coding format may include information relating to lower-frequency components of a signal (e.g., components at pos. 701 in FIG. 7). However, in the interest of bandwidth economy, the format preferably does not include complete information relating to higher-frequency components (pos. 702), which may be regenerated by the invention. The invention may in particular provide a decoding system with a control data reception unit configured to receive such control data, whether included in a received bit stream that also encodes the input signal or received as a separate signal or bit stream.

One embodiment provides a technique for efficiently carrying out computations occasioned by the inventive method. To this end, a hardware implementation may include a pre-normalizer for rescaling the magnitudes of corresponding input samples in some of the Y frames on which a frame of processed samples are to be based. After such rescaling, a processed sample can be computed as a (weighted) complex product of rescaled and, possibly, non-rescaled input samples. An input sample appearing as a rescaled factor in the product normally need not reappear as a non-rescaled factor. With the possible exception of the phase correction parameter $\theta$, it is possible to evaluate equation (13) as a product of (possibly rescaled) complex input samples. This represents a computational advantage in comparison with separate treatments of the magnitude and the phase of a processed sample.

In one embodiment, a system configured for the case Y=2 comprises two block extractors adapted to form one frame of input samples each, in parallel operation.

In a further development of the embodiments representing Y≥3, a system may comprise a plurality of subband processing units, each of which is configured to determine an intermediate synthesis subband signal using a different subband transposition factor and/or a different subband stretch factor and/or transposition method differing by being cross-product based or direct. The subband processing units may be arranged in parallel, for parallel operation. In this embodiment, the system may further comprise a merging unit arranged downstream of the subband processing units and upstream of the synthesis filter bank. The merging unit may be adapted to merge (e.g., by mixing together) corresponding intermediate synthesis subband signals to obtain the synthesis subband signal. As already noted, the intermediate synthesis subband which are merged may have been obtained by both direct and cross-product based harmonic transposition. A system according to the embodiment may further comprise a core decoder for decoding a bit stream into an input signal. It may also comprise a HFR processing unit adapted to apply spectral band information, notably by performing spectral shaping. The operation of the HFR processing unit may be controlled by information encoded in the bit stream.

One embodiment provides HFR of multi-dimensional signals, e.g., in a system for reproducing audio in a stereo format comprising Z channels, such as left, right, center, surround etc. In one possible implementation for processing an input signal with a plurality of channels, the processed samples of each channel are based on the same number of input samples although the stretch factor S and transposition factor Q for each band may vary between channels. To this end, the implementation may comprise an analysis filter bank for producing Y analysis subband signals from each channel, a subband processing unit for generating Z subband signals and a synthesis filter bank for generating Z time stretched and/or frequency transposed signals which form the output signal.

In variations to the preceding embodiment, the output signal may comprise output channels that are based on different numbers of analysis subband signals. For instance, it may be advisable to devote a greater amount of computational resources to HFR of acoustically prominent channels; e.g., channels to be reproduced by audio sources located in front a listener may be favored over surround or rear channels.

It is emphasized that the invention relates to all combinations of the above features, even if these are recited in different claims.

BRIEF DESCRIPTION OF THE DRAWINGS

The present invention will now be described by way of illustrative examples, not limiting the scope or spirit of the invention, with reference to the accompanying drawings.

DESCRIPTION OF PREFERRED EMBODIMENTS

The embodiments described below are merely illustrative for the principles of the present invention CROSS PRODUCT ENHANCED SUBBAND BLOCK BASED HARMONIC TRANSPOSITION. It is understood that modifications and variations of the arrangements and the details described herein will be apparent to others skilled in the art. It is the intent, therefore, that the invention be limited only by the scope of the appended patent claims and not by the specific details presented by way of description and explanation of the embodiments herein.

Figure 1:
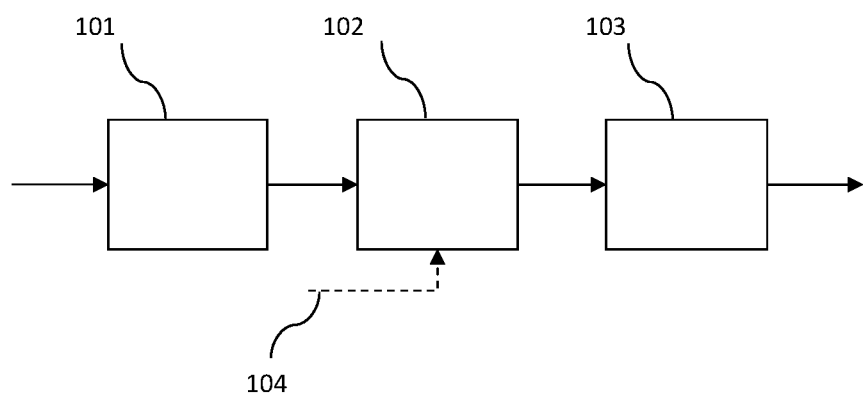
FIG. 1 illustrates the principle of subband block based harmonic transposition.

FIG. 1 illustrates the principle of subband block based transposition, time stretch, or a combination of transposition and time stretch. The input time domain signal is fed to an analysis filter bank 101 which provides a multitude of complex valued subband signals. These are fed to the subband processing unit 102, whose operation can be influenced by the control data 104. Each output subband can either be obtained from the processing of one or from two input subbands, or even as a superposition of the result of several such processed subbands. The multitude of complex valued output subbands is fed to a synthesis filter bank 103, which in turn outputs the modified time domain signal. The optional control data 104 describes the configuration and parameters of the subband processing, which may be adapted to the signal to be transposed. For the case of cross product enhanced transposition, this data may carry information relating to a dominating fundamental frequency.

Figure 2:
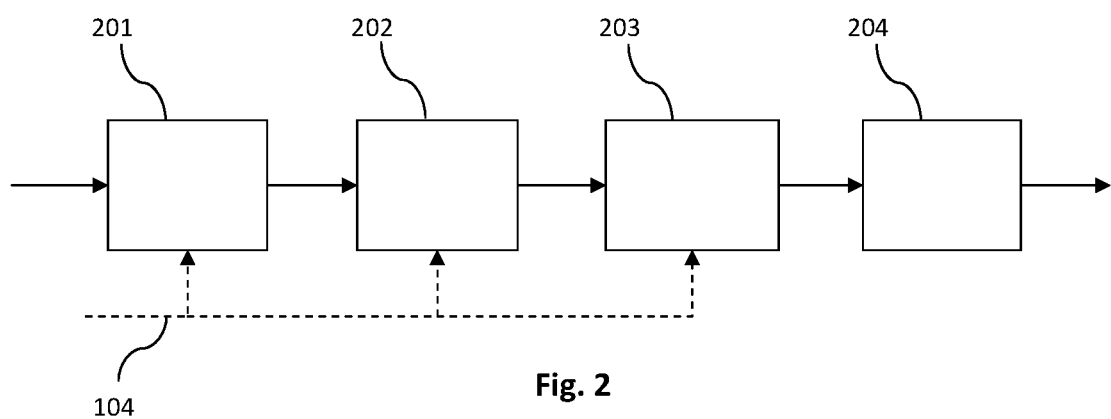
FIG. 2 illustrates the operation of nonlinear subband block processing with one subband input.

FIG. 2 illustrates the operation of nonlinear subband block processing with one subband input. Given the target values of physical time stretch and transposition, and the physical parameters of the analysis and synthesis filter banks 101 and 103, one deduces subband time stretch and transposition parameters as well as a source subband index for each target subband index. The aim of the subband block processing then is to realize the corresponding transposition, time stretch, or a combination of transposition and time stretch of the complex valued source subband signal in order to produce the target subband signal.

A block extractor 201 samples a finite frame of samples from the complex valued input signal. The frame is defined by an input pointer position and the subband transposition factor. This frame undergoes nonlinear processing in processing section 202 and is subsequently windowed by windows of finite and possibly variable length in windowing section 203. The resulting samples are added to previously output samples in an overlap and add unit 204 where the output frame position is defined by an output pointer position. The input pointer is incremented by a fixed amount and the output pointer is incremented by the subband stretch factor times the same amount. An iteration of this chain of operations will produce an output signal with duration being the subband stretch factor times the input subband signal duration, up to the length of the synthesis window, and with complex frequencies transposed by the subband transposition factor. The control signal 104 may influence each of the three sections 201, 202, 203.

Figure 3:
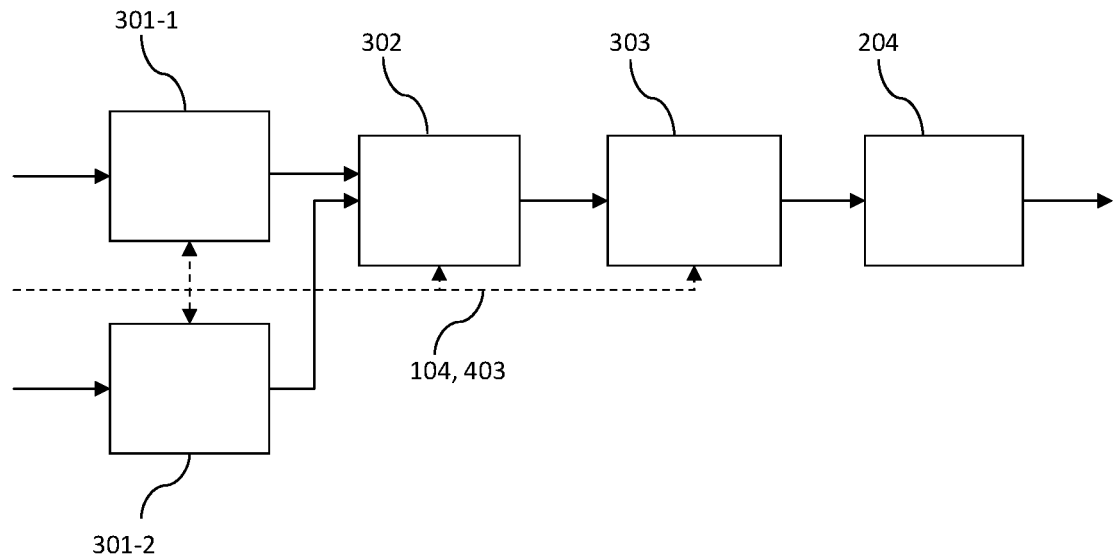
FIG. 3 illustrates the operation of nonlinear subband block processing with two subband inputs.

FIG. 3 illustrates the operation of nonlinear subband block processing with two subband inputs. Given the target values of physical time stretch and transposition, and the physical parameters of the analysis and synthesis filter banks 101 and 103, one deduces subband time stretch and transposition parameters as well as two source subband indices for each target subband index. In case the nonlinear subband block processing is to be used for creation of missing partials through cross product addition, the configuration of sections 301-1, 301-2, 302, 303, as well as the values of the two source subband indices, may depend on the output 403 of a cross processing control unit 404. The aim of the subband block processing is to realize the corresponding transposition, time stretch, or a combination of transposition and time stretch of the combination of the two complex valued source subband signals in order to produce the target subband signal. A first block extractor 301-1 samples a finite time frame of samples from the first complex valued source subband, and the second block extractor 301-2 samples a finite frame of samples from the second complex valued source subband. The frames are defined by a common input pointer position and the subband transposition factor. The two frames undergo nonlinear processing in 302 and are subsequently windowed by a finite length window in windowing section 303. The overlap and add unit 204 may have a similar or identical structure to that shown in FIG. 2. An iteration of this chain of operations will produce an output signal with duration being the subband stretch factor times the longest of the two input subband signals, (up to the length of the synthesis window). In case the two input subband signals carry the same frequencies, the output signal will have complex frequencies transposed by the subband transposition factor. In the case that the two subband signals carry different frequencies, the present invention teaches that the windowing 303 can be adapted to generate an output signal which has a target frequency suitable for the generation of missing partials in the transposed signal.

Figure 4:
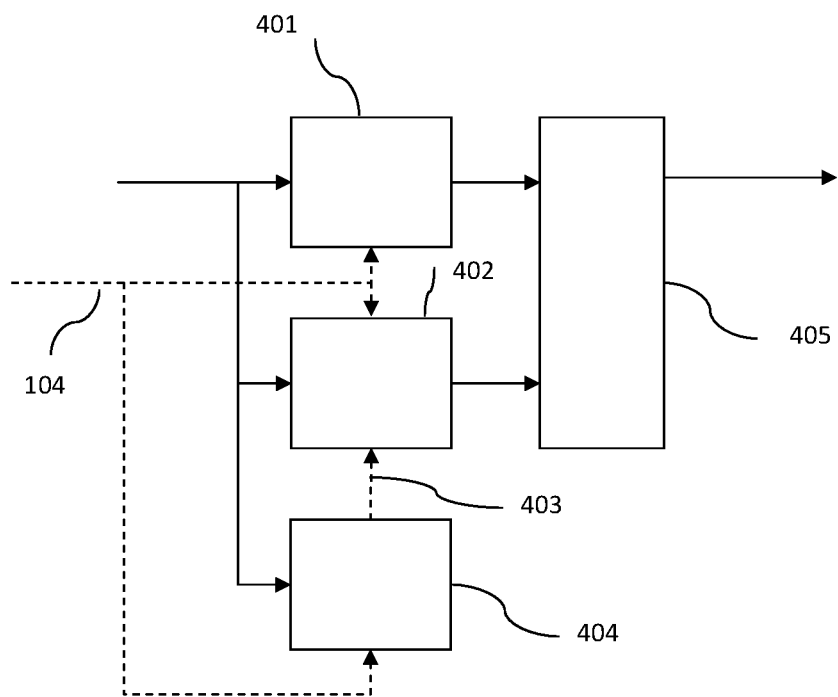
FIG. 4 illustrates the operation of cross product enhanced subband block based harmonic transposition.

FIG. 4 illustrates the principle of cross product enhanced subband block based transposition, time stretch, or a combination of transposition and time stretch. The direct subband processing unit 401 can be of the kind already described with reference to FIG. 2 (section 202) or FIG. 3. A cross subband processing unit 402 is also fed with the multitude of complex valued subband signals, and its operation is influenced by the cross processing control data 403. The cross subband processing unit 402 performs nonlinear subband block processing of the type with two subband inputs described in FIG. 3, and the output target subbands are added to those from the direct subband processing 401 in adder 405. The cross processing control data 403 may vary for each input pointer position and consists of at least
  a selected list of target subband indices;
  a pair of source subband indices for each selected target subband index; and
  a finite length synthesis window.

A cross processing control unit 404 furnishes this cross processing control data 403 given a portion of the control data 104 describing a fundamental frequency and the multitude of complex valued subband signals output from the analysis filter bank 101. The control data 104 may also carry other signal dependent configuration parameters which influence the cross product processing.

In the following text, a description of principles of cross product enhanced subband block based time stretch and transposition will be outlined with reference to FIGS. 1-4, and by adding appropriate mathematical terminology.

The two main configuration parameters of the overall harmonic transposer and/or time stretcher are
  $S_\varphi$: the desired physical time stretch factor; and
  $Q_\varphi$: the desired physical transposition factor.

The filter banks 101 and 103 can be of any complex exponential modulated type such as QMF or a windowed DFT or a wavelet transform. The analysis filter bank 101 and the synthesis filter bank 103 can be evenly or oddly stacked in the modulation and can be defined from a wide range of prototype filters and/or windows. While all these second order choices affect the details in the subsequent design such as phase corrections and subband mapping management, the main system design parameters for the subband processing can typically be derived from the two quotients $\Delta t_S/\Delta t_A$ and $\Delta f_S/\Delta f_A$ of the following four filter bank parameters, all measured in physical units. In the above quotients,
  $\Delta t_A$ is the subband sample time step or time stride of the analysis filter bank 101 (e.g. measured in seconds [s]);
  $\Delta f_A$ is the subband frequency spacing of the analysis filter bank 101 (e.g. measured in Hertz [1/s]);
  $\Delta t_S$ is the subband sample time step or time stride of the synthesis filter bank 103 (e.g. measured in seconds [s]); and
  $\Delta f_S$ is the subband frequency spacing of the synthesis filter bank 103 (e.g. measured in Hertz [1/s]).

For the configuration of the subband processing unit 102, the following parameters should be computed:
  S: the subband stretch factor, i.e. the stretch factor which is applied within the subband processing unit 102 as a ratio of input and output samples in order to achieve an overall physical time stretch of the time domain signal by $S_\varphi$;
  Q: the subband transposition factor, i.e. the transposition factor which is applied within the subband processing unit 102 in order to achieve an overall physical frequency transposition of the time domain signal by the factor $Q_\varphi$; and
  the correspondence between source and target subband indices, wherein n denotes an index of an analysis subband entering the subband processing unit 102, and m denotes an index of a corresponding synthesis subband at the output of the subband processing unit 102.

In order to determine the subband stretch factor S, it is observed that an input signal to the analysis filter bank 101 of physical duration D corresponds to a number $D/\Delta t_A$ of analysis subband samples at the input to the subband processing unit 102. These $D/\Delta t_A$ samples will be stretched to $S \cdot D/\Delta t_A$ samples by the subband processing unit 102 which applies the subband stretch factor S. At the output of the synthesis filter bank 103 these $S \cdot D/\Delta t_A$ samples result in an output signal having a physical duration of $\Delta t_S \cdot S \cdot D/\Delta t_A$. Since this latter duration should meet the specified value $S_\varphi \cdot D$, i.e. since the duration of the time domain output signal should be time stretched compared to the time domain input signal by the physical time stretch factor $S_\varphi$, the following design rule is obtained:

$$S = \frac{\Delta t_A}{\Delta t_S} S_\varphi. \tag{1}$$

In order to determine the subband transposition factor Q which is applied within the subband processing unit 102 in order to achieve a physical transposition $Q_\varphi$, it is observed that an input sinusoid to the analysis filter bank 101 of physical frequency $\Omega$ will result in a complex analysis subband signal with discrete time angular frequency $\omega = 2\pi\Omega \cdot \Delta t_A$ and the main contribution occurs within the analysis subband with index $n \approx \Omega/\Delta f_A$. An output sinusoid at the output of the synthesis filter bank 103 of the desired transposed physical frequency $Q_\varphi \cdot \Omega$ will result from feeding the synthesis subband with index $m \approx Q_\varphi \cdot \Omega/\Delta f_S$ with a complex subband signal of discrete angular frequency $2\pi Q_\varphi \cdot \Omega \cdot \Delta t_S$. In this context, care should be taken in order to avoid the synthesis of aliased output frequencies different from $Q_\varphi \cdot \Omega$. Typically this can be avoided by making appropriate second order choices as discussed, e.g. by selecting appropriate analysis and/or synthesis filter banks. The discrete frequency $2\pi Q_\varphi \cdot \Omega \cdot \Delta t_S$ at the output of the subband processing unit 102 should correspond to the discrete time frequency $\omega = 2\pi\Omega \cdot \Delta t_A$ at the input of the subband processing unit 102 multiplied by the subband transposition factor Q. I.e., by setting equal $2\pi Q\Omega\Delta t_A$ and $2\pi Q_\varphi \cdot \Omega \cdot \Delta t_S$, the following relation between the physical transposition factor $Q_\varphi$ and the subband transposition factor Q may be determined:

$$Q = \frac{\Delta t_S}{\Delta t_A} Q_\varphi. \tag{2}$$

Likewise, the appropriate source or analysis subband index n of the subband processing unit 102 for a given target or synthesis subband index m should obey $$n \approx \frac{\Delta f_s}{\Delta f_A} \cdot \frac{1}{Q_\varphi} m. \qquad (3)$$

In one embodiment, it holds that $\Delta f_S/\Delta f_A = Q_\varphi$, i.e. the frequency spacing of the synthesis filter bank 103 corresponds to the frequency spacing of the analysis filter bank 101 multiplied by the physical transposition factor, and the one-to-one mapping of analysis to synthesis subband index n=m can be applied. In other embodiments, the subband index mapping may depend on the details of the filter bank parameters. In particular, if the fraction of the frequency spacing of the synthesis filter bank 103 and the analysis filter bank 101 is different from the physical transposition factor $Q_\varphi$, one or two source subbands may be assigned to a given target subband. In the case of two source subbands, it may be preferable to use two adjacent source subbands with index n, n+1, respectively. That is, the first and second source subbands are given by either (n(m), n(m)+1) or (n(m)+1, n(m)).

The subband processing of FIG. 2 with a single source subband will now be described as a function of the subband processing parameters S and Q. Let x(k) be the input signal to the block extractor 201, and let h be the input block stride. I.e., x(k) is a complex valued analysis subband signal of an analysis subband with index n. The block extracted by the block extractor 201 can without loss of generality be considered to be defined by the $L = R_1 + R_2$ samples $$x_l(k) = x(Qk + hl), k = -R_1, \ldots R_2 - 1, \qquad (4)$$

wherein the integer l is a block counting index, L is the block length and $R_1$, $R_2$ are nonnegative integers. Note that for Q=1, the block is extracted from consecutive samples but for Q>1, a downsampling is performed in such a manner that the input addresses are stretched out by the factor Q. If Q is an integer this operation is typically straightforward to perform, whereas an interpolation method may be required for non-integer values of Q. This statement is relevant also for non-integer values of the increment h, i.e. of the input block stride. In an embodiment, short interpolation filters, e.g. filters having two filter taps, can be applied to the complex valued subband signal. For instance, if a sample at the fractional time index k+0.5 is required, a two tap interpolation of the form x(k+0.5)≈ax(k)+bx(k+1), where the coefficients a, b may be constants or may depend on a subband index (see, e.g., WO2004/097794 and WO2007/085275), may ensure a sufficient quality.

An interesting special case of formula (4) is $R_1=0$, $R_2=1$ where the extracted block consists of a single sample, i.e. the block length is L=1.

With the polar representation of a complex number $z = |z|\exp(i\angle z)$, wherein $|z|$ is the magnitude of the complex number and $\angle z$ is the phase of the complex number, the nonlinear processing unit 202 producing the output frame $y_t$ from the input frame $x_t$ is advantageously defined by the phase modification factor T=SQ through $$\begin{cases} \angle y_l(k) = (T-1)\angle x_l(0) + \angle x_l(k) + \theta \\ |y_l(k)| = |x_l(0)|^\rho |x_l(k)|^{1-\rho} \end{cases}, \quad k = -R_1, \ldots R_2 - 1 \qquad (5)$$

where $\rho \in [0,1]$ is a geometrical magnitude weighting parameter. The case $\rho=0$ corresponds to a pure phase modification of the extracted block. A particularly attractive value of the magnitude weighting is $\rho=1-1/T$ for which a certain computational complexity relief is obtained irrespectively of the block length L, and the resulting transient response is somewhat improved over the case $\rho=0$. The phase correction parameter θ depends on the filter bank details and the source and target subband indices. In an embodiment, the phase correction parameter θ may be determined experimentally by sweeping a set of input sinusoids. Furthermore, the phase correction parameter θ may be derived by studying the phase difference of adjacent target subband complex sinusoids or by optimizing the performance for a Dirac pulse type of input signal. Finally, with a suitable design of the analysis and synthesis filter banks 101 and 103, the phase correction parameter θ may be set to zero, or omitted. The phase modification factor T should be an integer such that the coefficients T−1 and 1 are integers in the linear combination of phases in the first line of formula (5). With this assumption, i.e. with the assumption that the phase modification factor T is an integer, the result of the nonlinear modification is well defined even though phases are ambiguous by identification modulo 2π.

In words, formula (5) specifies that the phase of an output frame sample is determined by offsetting the phase of a corresponding input frame sample by a constant offset value. This constant offset value may depend on the modification factor T, which itself depends on the subband stretch factor and/or the subband transposition factor. Furthermore, the constant offset value may depend on the phase of a particular input frame sample from the input frame. This particular input frame sample is kept fixed for the determination of the phase of all the output frame samples of a given block. In the case of formula (5), the phase of the center sample of the input frame is used as the phase of the particular input frame sample.

The second line of formula (5) specifies that the magnitude of a sample of the output frame may depend on the magnitude of the corresponding sample of the input frame. Furthermore, the magnitude of a sample of the output frame may depend on the magnitude of a particular input frame sample. This particular input frame sample may be used for the determination of the magnitude of all the output frame samples. In the case of formula (5), the center sample of the input frame is used as the particular input frame sample. In an embodiment, the magnitude of a sample of the output frame may correspond to the geometrical mean of the magnitude of the corresponding sample of the input frame and the particular input frame sample.

In the windowing unit 203, a window w of length L is applied on the output frame, resulting in the windowed output frame $$z_l(k) = w(k)y_l(k), k = -R_1, \ldots R_2 - 1. \qquad (6)$$

Finally, it is assumed that all frames are extended by zeros, and the overlap and add operation 204 is defined by $$z(k) = \sum_l z_l(k - Shl), \qquad (7)$$

wherein it should be noted that the overlap and add unit 204 applies a block stride of Sh, i.e., a time stride which is S times higher than the input block stride h. Due to this difference in time strides of formula (4) and (7) the duration of the output signal z(k) is S times the duration of the input signal x(k), i.e., the synthesis subband signal has been stretched by the subband stretch factor S compared to the analysis subband signal. It should be noted that this observation typically applies if the length L of the window is negligible in comparison to the signal duration.

For the case where a complex sinusoid is used as input to the subband processing 102, i.e., an analysis subband signal corresponding to a complex sinusoid $$x(k) = C \exp(i\omega k), \quad (8)$$

it may be determined by applying the formulas (4)-(7) that the output of the subband processing 102, i.e. the corresponding synthesis subband signal, is given by $$z(k) = |C|\exp[i(TLC + \theta + Q\omega k)]\sum_l w(k - Shl). \quad (9)$$

independently of $\rho$. Hence, a complex sinusoid of discrete time frequency $\omega$ will be transformed into a complex sinusoid with discrete time frequency $Q\omega$ provided the synthesis window shifts with a stride of $Sh$ sum up to the same constant value $K$ for all $k$, $$\sum_l w(k - Shl) = K. \quad (10)$$

It is illustrative to consider the special case of pure transposition where $S=1$ and $T=Q$. If the input block stride is $h=1$ and $R_1=0$, $R_2=1$, all the above, i.e. notably formula (5), reduces to the point-wise or sample based phase modification rule $$\left\{ \begin{array}{l} Lz(k) = TLx(k) + \theta \\ |z(k)| = |x(k)| \end{array} \right\}. \quad (11)$$

The subband processing unit 102 may use the control data 104 to set certain processing parameters, e.g. the block length of the block extractors.

In the following, the description of the subband processing will be extended to cover the case of FIG. 3 with two subband inputs. Let $x^{(1)}(k)$ be the input subband signal to the first block extractor 301-1 and let $x^{(2)}(k)$ be the input subband signal to the second block extractor 301-2. Each extractor can use a different downsampling factor, leading to the extracted blocks $$\left\{ \begin{array}{l} x_l^{(1)}(k) = x^{(1)}(D_1 k + hl) \\ x_l^{(2)}(k) = x^{(2)}(D_2 k + hl) \end{array} \right\} k = -R_1, \ldots R_2 - 1. \quad (12)$$

The nonlinear processing 302 produces the output frame $y_l$ and may be defined by $$\left\{ \begin{array}{l} Ly_l(k) = T_1 L x_l^{(1)}(k) + T_2 L x_l^{(2)}(k) + \theta \\ |y_l(k)| = |x_l^{(1)}(k)|^{1-\rho}|x_l^{(2)}(k)|^\rho \end{array} \right\}, \quad (13)$$

the processing in 303 is again described by (6) and (7) and 204 is identical to the overlap and add processing described in the context of the single input case.

The definition of the nonnegative real parameters $D_1$, $D_2$, $\rho$ and the nonnegative integer parameters $T_1$, $T_2$ and the synthesis window $w$ now depends on the desired operation mode. Note that if the same subband is fed to both inputs, $x^{(1)}(k) = x^{(2)}(k)$ and $D_1=Q$, $D_2=0$, $T_1=1$, $T_2=T-1$, the operations in (12) and (13) reduce to those of (4) and (5) in the single input case.

In one embodiment, wherein the ratio of the frequency spacing $\Delta f_S$ of the synthesis filter bank 103 and the frequency spacing $\Delta f_A$ of the analysis filter bank 101 is different from the desired physical transposition factor $Q_\varphi$, it may be beneficial to determine the samples of a synthesis subband with index m from two analysis subbands with index n, n+1, respectively. For a given index m, the corresponding index n may be given by the integer value obtained by truncating the analysis index value n given by formula (3). One of the analysis subband signals, e.g., the analysis subband signal corresponding to index n, is fed into the first block extractor 301-1 and the other analysis subband signal, e.g. the one corresponding to index n+1, is fed into the second block extractor 301-2. Based on these two analysis subband signals a synthesis subband signal corresponding to index m is determined in accordance with the processing outlined above. The assignment of the adjacent analysis subband signals to the two block extractors 301-1 and 302-1 may be based on the remainder that is obtained when truncating the index value of formula (3), i.e. the difference of the exact index value given by formula (3) and the truncated integer value n obtained from formula (3). If the remainder is greater than 0.5, then the analysis subband signal corresponding to index n may be assigned to the second block extractor 301-2, otherwise this analysis subband signal may be assigned to the first block extractor 301-1. In this operation mode, the parameters may be designed such that input subband signals sharing the same complex frequency $\omega$, $$\left\{ \begin{array}{l} x^{(1)}(k) = C_1 \exp(i\omega k) \\ x^{(2)}(k) = C_2 \exp(i\omega k) \end{array} \right\}, \quad (14)$$

lead to an output subband signal being a complex sinusoid with discrete time frequency $Q\omega$. It turns out that this happens if the following relations hold:

$$\left\{ \begin{array}{l} Q = T_1 D_1 + T_2 D_2 \\ SQ = T_1 + T_2 \end{array} \right\}. \quad (15)$$

For the operation mode of generating missing partials by means of cross products, the design criteria are different. Returning to the physical transposition parameter $Q_\varphi$, the aim of a cross product addition is to produce output at the frequencies $Q_\varphi \Omega + r\Omega_0$ for $r=1, \ldots, Q_\varphi-1$ given inputs at frequencies $\Omega$ and $\Omega + \Omega_0$, where $\Omega_0$ is a fundamental frequency belonging to a dominant pitched component of the input signal. As described in WO2010/081892, the selective addition of those terms will result in a completion of the harmonic series and a significant reduction of the ghost pitch artifact.

A constructive algorithm for operating the cross processing control 404 will now be outlined. Given a target output subband index m, the parameter $r=1, \ldots, Q_\varphi-1$ and the fundamental frequency $\Omega_0$, one can deduce appropriate source subband indices $n_1$ and $n_2$ by solving the following system of equations in an approximate sense, $$\left\{ \begin{array}{l} m + \sigma = \dfrac{Q_\varphi \Omega + r\Omega_0}{\Delta f_S} \\ n_1 + \sigma = \dfrac{\Omega}{\Delta f_A} \\ n_2 + \sigma = \dfrac{\Omega + \Omega_0}{\Delta f_A} \end{array} \right\}, \quad (16)$$

where σ=½ for oddly stacked filter bank modulation (as typically used for QMF and MDCT filter banks) and σ=0 for evenly stacked filter bank modulation (as typically used for FFT filter banks).

With the definitions $p=\Omega_0/\Delta f_A$: the fundamental frequency measured in units of the analysis filter bank frequency spacing;

$F=\Delta f_s/\Delta f_A$: the quotient of synthesis to analysis subband frequency spacing; and $$n^f = \frac{(m+\sigma)F - rp}{Q_\varphi} - \sigma;$$

the real valued target for an integer valued lower source index, an example of advantageous approximate solution to (16) is given by selecting $n_1$ as the integer closest to $n^f$, and $n_2$ as the integer closest to $n^f+p$.

If the fundamental frequency is smaller than the analysis filter bank spacing, that is if p<1, it may be advantageous to cancel the addition of a cross product.

As it is taught in WO2010/081892, a cross product should not be added to an output subband which already has a significant main contribution from the transposition without cross products. Moreover, at most one of cases r=1, . . . , $Q_\varphi-1$ should contribute to the cross product output. Here, these rules may be carried out by performing the following three steps for each target output subband index m:

1. Compute the maximum $M_C$ over all choices of r=1, . . . $Q_\varphi-1$ of the minimum of the candidate source subband magnitudes $|x^{(1)}|$ and $|x^{(2)}|$ evaluated in (or from a neighborhood of) the central time slot k=hl, wherein the source subbands $x^{(1)}$ and $x^{(2)}$ may be given by indices $n_1$ and $n_2$ as in equation (16);
2. Compute the corresponding magnitude $M_S$ for the direct source term |x| obtained from a source subband with index $$n = \frac{F}{Q_\varphi}m; \quad \text{(cf. eq. 3)}$$

3. Activate the cross term from a winning choice for $M_C$ in point 1 above only if $M_C > qM_S$, where q is a predetermined threshold value.

Variations to this procedure may be desirable depending on the particular system configuration parameters. One such variation is to replace the hard thresholding of point 3 with softer rules depending on the quotient $M_C/M_S$. Another variation is to expand the maximization in point 1 to more than $Q_\varphi-1$ choices, for example defined by a finite list of candidate values for fundamental frequency measured in analysis frequency spacing units p. Yet another variation is to apply different measures of the subband magnitudes, such as the magnitude of a fixed sample, a maximal magnitude, an average magnitude, a magnitude in $l^p$-norm sense, etc.

The list of target source bands m selected for addition of a cross product together with the values of $n_1$ and $n_2$ constitutes a main part of the cross processing control data 403. What remains to be described is the configuration parameters $D_1$, $D_2$, $\rho$, the nonnegative integer parameters $T_1$, $T_2$ appearing in the phase rotation (13) and the synthesis window w to be used in the cross subband processing 402. Inserting the sinusoidal model for the cross product situation leads to the following source subband signals:

$$\begin{cases} x^{(1)}(k) = C_1 \exp(i\omega k) \\ x^{(2)}(k) = C_2 \exp(i(\omega + \omega_0)k) \end{cases}, \quad (17)$$

where $\omega=2\pi\Omega\Delta t_A$ and $\omega_0=2\pi\Omega\Delta t_A$. Likewise, the desired output subband is of the form $$z(k) = C_3 \exp[iQ(\omega + r\omega_0/Q_\varphi)k]. \quad (18)$$

Computations reveal that this target output can be achieved if (15) is fulfilled jointly with $$\frac{T_2}{T_1 + T_2} = \frac{r}{Q_\varphi}. \quad (19)$$

The conditions (15) and (19) are equivalent to $$\begin{cases} T_1 = (Q_\varphi - r)S_\varphi \\ T_2 = rS_\varphi \\ (Q_\varphi - r)D_1 + rD_2 = Q_\varphi/S \end{cases}, \quad (20)$$

which defines the integer factors $T_1$, $T_2$ for the phase modification in (13) and provides some design freedom in setting the values of downsampling factors $D_1$, $D_2$. The magnitude weighting parameter may be advantageously chosen to $\rho=r/Q_\varphi$. As can be seen, these configuration parameters only depend on the fundamental frequency $\Omega_0$ through the selection of r. However, for (18) to hold, a new condition on the synthesis window w emerges, namely $$\begin{cases} \sum_i \tilde{w}(k - Shl) = K, \text{ with} \\ \tilde{w}(v) = w(v)\exp(i\alpha v), \\ \alpha = 2\pi p \frac{r(Q_\varphi - r)}{Q_\varphi}(D_2 - D_1)\Delta t_A \Delta f_A S_\varphi \end{cases}. \quad (21)$$

A synthesis window w which satisfies (21) either exactly or approximately is to be provided as the last piece of cross processing control data 403.

It is noted that the above algorithm for computing cross processing control data 403 on the basis of input parameters, such as a target output subband index m and a fundamental frequency $\Omega_0$, is of a purely exemplifying nature and as such does not limit the scope of the invention. Variations of this disclosure within the skilled person's knowledge and routine experimentation—e.g., a further subband block based processing method providing a signal (18) as output in response to input signals (17)—fall entirely within the scope of the invention.

Figure 5:
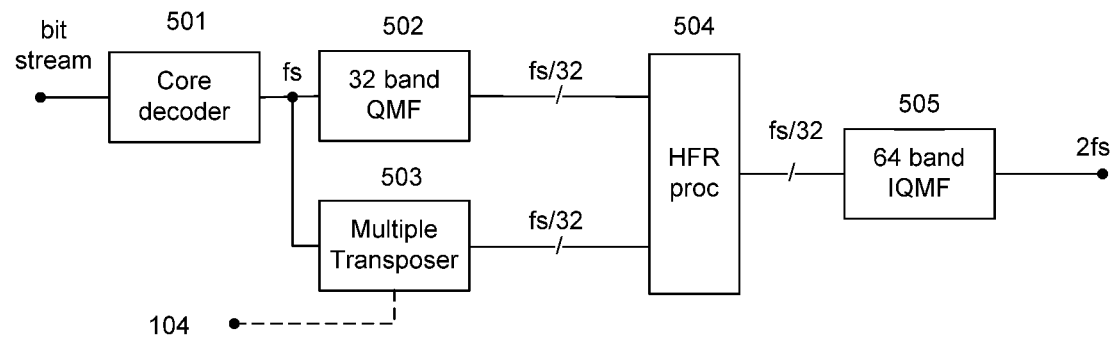
FIG. 5 illustrates an example scenario for the application of subband block based transposition using several orders of transposition in a HFR enhanced audio codec.

FIG. 5 illustrates an example scenario for the application of subband block based transposition using several orders of transposition in a HFR enhanced audio codec. A transmitted bit-stream is received at a core decoder 501, which provides a low bandwidth decoded core signal at a sampling frequency fs. The low bandwidth decoded core signal is resampled to the output sampling frequency 2fs by means of a complex modulated 32 band QMF analysis bank 502 followed by a 64 band QMF synthesis bank (Inverse QMF) 505. The two filter banks 502 and 505 share the same physical parameters $\Delta t_S = \Delta t_A$ and $\Delta f_S = \Delta f_A$, and the HFR processing unit 504 simply lets through the unmodified lower subbands corresponding to the low bandwidth core signal. The high frequency content of the output signal is obtained by feeding the higher subbands of the 64 band QMF synthesis bank 505 with the output bands from a multiple transposer unit 503, subject to spectral shaping and modification performed by a HFR processing unit 504. The multiple transposer 503 takes as input the decoded core signal and outputs a multitude of subband signals which represent the 64 QMF band analysis of a superposition or combination of several transposed signal components. The objective is that if the HFR processing is bypassed, each component corresponds to an integer physical transposition without time stretch of the core signal ($Q_\varphi$=2, 3, . . . , and $S_\varphi$=1). In the inventive scenario, the transposer control signal 104 contains data describing a fundamental frequency. This data can either be transmitted via the bitstream from the corresponding audio encoder, deduced by pitch detection in the decoder, or obtained from a combination of transmitted and detected information.

Figure 6:
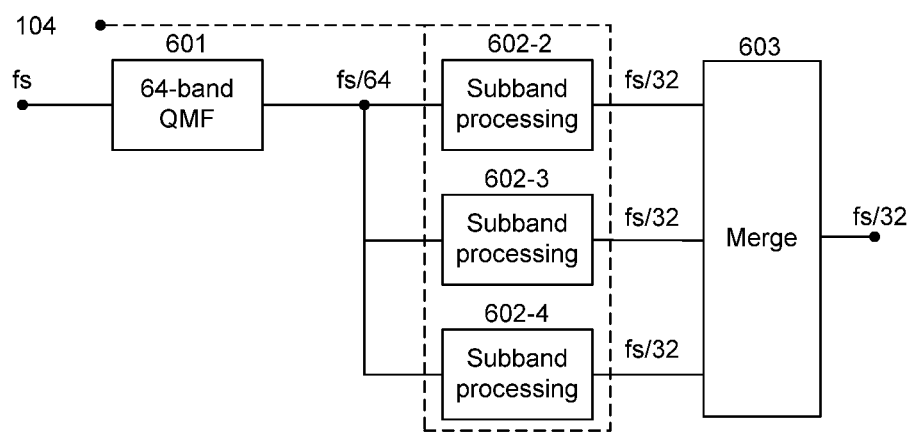
FIG. 6 illustrates an example scenario for the operation of a multiple order subband block based transposition applying a 64 band QMF analysis filter bank.

FIG. 6 illustrates an example scenario for the operation of a multiple order subband block based transposition applying a single 64 band QMF analysis filter bank. Here three transposition orders $Q_\varphi$=2,3,4 are to be produced and delivered in the domain of a 64 band QMF operating at output sampling rate 2fs. The merge unit 603 simply selects and combines the relevant subbands from each transposition factor branch into a single multitude of QMF subbands to be fed into the HFR processing unit. The objective is specifically that the processing chain of a 64 band QMF analysis 601, a subband processing unit 602-$Q_\varphi$, and a 64 band QMF synthesis 505 results in a physical transposition of $Q_\varphi$ with $S_\varphi$=1 (i.e. no stretch). Identifying these three blocks with 101, 102 and 103 of FIG. 1, one finds that $\Delta t_A$=64fs and $\Delta f_A$=fs/128 so $\Delta t_S/\Delta t_A$=½ and $F=\Delta f_S/\Delta f_A$=2. A design of specific configuration parameters for 602-$Q_\varphi$ will be described separately for each case $Q_\varphi$=2, 3, 4. For all cases, the analysis stride is chosen to be h=1, and it is assumed that the normalized fundamental frequency parameter $p=\Omega_0/\Delta_A=128\Omega_0/fs$ is known.

Consider first the case $Q_\varphi$=2. Then 602-2 has to perform a subband stretch of S=2, a subband transposition of Q=1 (i.e. none) and the correspondence between source n and target subbands m is given by n=m for the direct subband processing. In the inventive scenario of cross product addition, there is only one type of cross product to consider, namely r=1 (see above, after equation (15)), and the equations (20) reduce to $T_1=T_2=1$ and $D_1+D_2=1$. An exemplary solution consists of choosing $D_1=0$ and $D_2=1$. For the direct processing synthesis window, a rectangular window of even length L=10 with $R_1=R_2=5$ may be used as it satisfies the condition (10). For the cross processing synthesis window, a short L=2 tap window can be used, with $R_1=R_2=1$, in order to keep the additional complexity of the cross products addition to a minimum. After all, the beneficial effect of using a long block for the subband processing is most notable in the case of complex audio signals, where unwanted intermodulation terms are suppressed; for the case of a dominant pitch, such artifacts are less probable to occur. The L=2 tap window is the shortest one that can satisfy (10) since h=1 and S=2. By the present invention, however, the window advantageously satisfies (21). For the parameters at hand, this amounts to $$\begin{cases} \tilde{w}(-1) = \tilde{w}(0) \\ \tilde{w}(\nu) = w(\nu)\exp(i\alpha\nu), \\ \alpha = \pi p/2 \end{cases}$$

which is fulfilled by choosing w(0)=1 and w(−1)=exp(iα) =exp(iπp/2).

For the case $Q_\varphi$=3 the specifications for 602-3 given by (1)-(3) are that it has to perform a subband stretch of S=2, a subband transposition of Q=3/2 and that the correspondence between source n and target m subbands for the direct term processing is given by n≈2m/3. There are two types of cross product terms r=1,2, and the equations (20) reduce to $$\begin{cases} T_1 = 3 - r \\ T_2 = r \\ (3-r)D_1 + rD_2 = 3/2 \end{cases}.$$

An exemplary solution consists of choosing the down-sampling parameters as
$D_1=0$ and $D_2=3/2$ for r=1;
$D_1=3/2$ and $D_2=0$ for r=2.

For the direct processing synthesis window, a rectangular window of even length L=8 with $R_1=R_2=4$ may be used. For the cross processing synthesis window, a short L=2 tap window can be used, with $R_1=R_2=1$, and satisfying $$\begin{cases} \tilde{w}(-1) = \tilde{w}(0) \\ \tilde{w}(\nu) = w(\nu)\exp(i\alpha\nu), \\ \alpha = \pi p \dfrac{r(3-r)}{3}(D_2 - D_1) \end{cases},$$

which is fulfilled by choosing w(0)=1 and w(−1)=exp(iα).

For the case $Q_\varphi$=4, the specifications for 602-4 given by (1)-(3) are that it has to perform a subband stretch of S=2, a subband transposition of Q=2 and that the correspondence between source n and target subbands m for the direct term processing is given is by n≈2m. There are three types of cross product terms r=1,2,3, and the equations (20) reduce to $$\begin{cases} T_1 = 4 - r \\ T_2 = r \\ (4-r)D_1 + rD_2 = 2 \end{cases}.$$

An exemplary solution consists of choosing
$D_1=0$ and $D_2=2$ for r=1;
$D_1=0$ and $D_2=1$ for r=2;
$D_1=2$ and $D_2=0$ for r=3;

For the direct processing synthesis window, a rectangular window of even length L=6 with $R_1=R_2=3$ may be used. For the cross processing synthesis window, a short L=2 tap window can be used, with $R_1=R_2=1$, and satisfying $$\begin{cases} \tilde{w}(-1) = \tilde{w}(0) \\ \tilde{w}(\nu) = w(\nu)\exp(i\alpha\nu), \\ \alpha = \pi p \dfrac{r(4-r)}{4}(D_2 - D_1) \end{cases},$$

which is fulfilled by choosing w(0)=1 and w(−1)=exp(iα).

In each of the above cases where more than one r value is applicable, a selection will take place, e.g., similarly to the three-step procedure described before equation (17).

Figure 7:
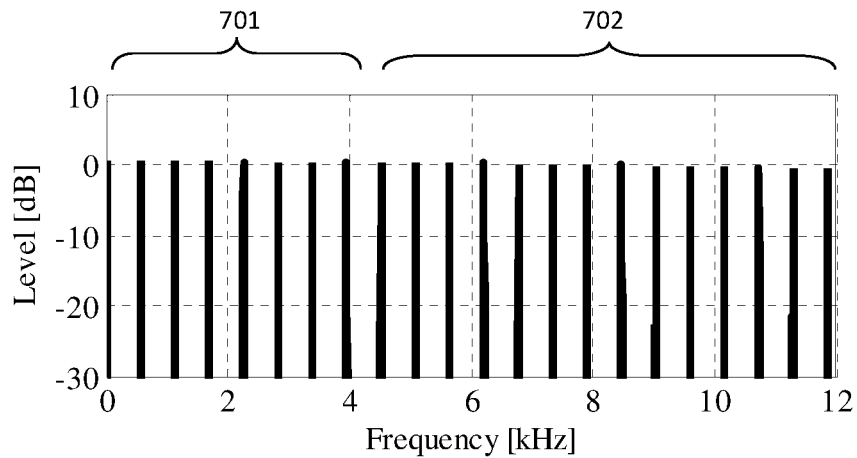
FIGS. 7 and 8 illustrate experimental results of the described subband block based transposition method.

FIG. 7 depicts the amplitude spectrum of a harmonic signal with fundamental frequency $\Omega_0$=564.7 Hz. The low frequency part 701 of the signal is to be used as input for a multiple transposer. The purpose of the transposer is to generate a signal as close as possible to the high frequency part 702 of the input signal, so that transmission of the high-frequency part 702 becomes non-imperative and available bit rate can be used economically.

Figure 8:
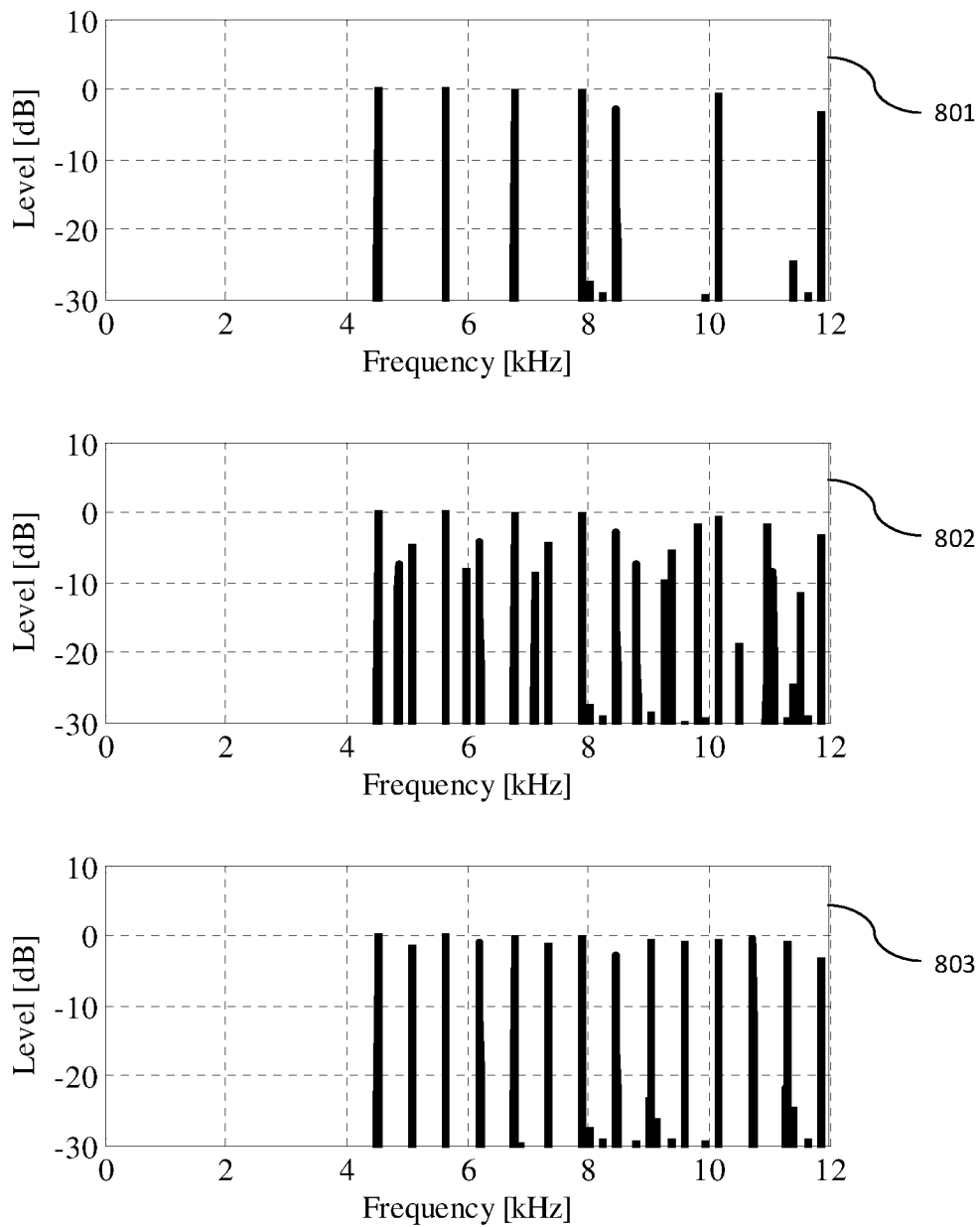

FIG. 8 depicts the amplitude spectrum of outputs from a transposer which has the low frequency part 701 of the signal of FIG. 7 as input. The multiple transposer is constructed by using 64 band QMF filter banks, input sampling frequency fs=14400 Hz, and in accordance with the description of FIG. 5. For clarity however, only the two transposition orders $Q_\varphi=2,3$ are considered. The three different panels 801-803 represent the final output obtained by using different settings of the cross processing control data.

The top panel 801 depicts the output spectrum obtained if all cross product processing is canceled and only the direct subband processing 401 is active. This will be the case if the cross processing control 404 receives no pitch or p=0. Transposition by $Q_\varphi=2$ generates the output in the range from 4 to 8 kHz and transposition by $Q_\varphi=3$ generates the output in the range from 8 to 12 kHz. As it can be seen, the created partials are increasingly far apart and the output deviates significantly from the target high frequency signal 702. Audible double and triple "ghost" pitch artifacts will be present in the resulting audio output.

The middle panel 802 depicts the output spectrum obtained if cross product processing is active, the pitch parameter p=5 is used (which is an approximation to $128\Omega_0/fs=5.0196$), but a simple two tap synthesis window with $w(0)=w(-1)=1$, satisfying condition (10), is used for the cross subband processing. This amounts to a straightforward combination of subband block based processing and cross-product enhanced harmonic transposition. As it can be seen, the additional output signal components compared to 801 do not align well with the desired harmonic series. This shows that it leads to insufficient audio quality to use the procedure inherited from the design of direct subband processing for the cross product processing.

The bottom panel 803 depicts the output spectrum obtained from the same scenario as for the middle panel 802, but now with the cross subband processing synthesis windows given by the formulas described in the cases $Q_\varphi=2,3$ of FIG. 5. That is, a two tap window of the form $w(0)=1$ and $w(-1)=\exp(i\alpha)$ satisfying (21) and with the feature taught by the present invention that it depends on the value of p. As it can be seen, the combined output signal aligns very well with the desired harmonic series of 702.

Figure 9:
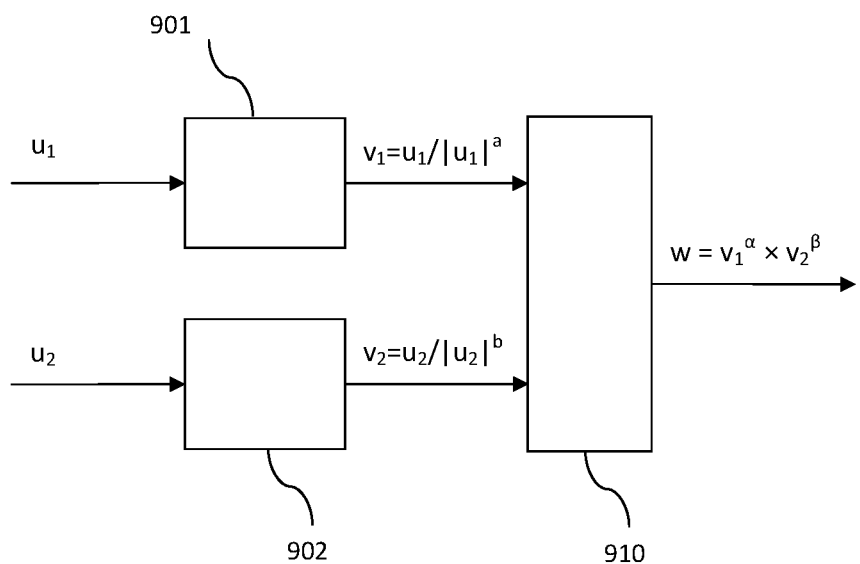
FIG. 9 shows a detail of the non-linear processing unit of FIG. 2, including a pre-normalizer and a multiplier.

FIG. 9 shows a portion of the non-linear processing frame processing unit 202 including sections configured to receive two input samples $u_1, u_2$ and to generate based on these a processed sample w, whose magnitude is given by a geometric mean of the magnitudes of the input samples and whose phase is a linear combination of the phases of the input samples, that is, $$\begin{cases} |w| = |u_1|^\rho |u_2|^{1-\rho} \\ \arg w = T_1 \arg u_1 + T_2 \arg u_2 \end{cases} \quad (22)$$

It is possible to obtain the processed sample w according to this specification by pre-normalizing each of the input samples $u_1, u_2$ at a respective pre-normalizer 901, 902 and multiplying the pre-normalized input samples $v_1=u_1/|u_1|^a$, $v_2=u_2/|u_2|^b$ at a weighted multiplier 910, which outputs $w=v_1^\alpha v_1^\beta$. Clearly, the operation of the pre-normalizers 901, 902 and the weighted multiplier 910 is determined by input parameters a, b, a and R. It is easy to verify that equations (22) will be fulfilled if $\alpha=T_1$, $\beta=T_2$, $a=1-\rho/T_1$, $b=1-(1-\rho)/T_2$. The skilled person will readily be able to generalize this layout to an arbitrary number No of input samples, wherein a multiplier is supplied with No input samples, of which some or all have undergone pre-normalization. One observes, then, that a common pre-normalization (a=b, implying that the pre-normalizers 901, 902 produce identical results) is possible if the parameter ρ is set to $\rho=T_1/(T_1+T_2)$. This results in a computational advantage when many subbands are considered, since a common pre-normalization step can be effected on all candidate subbands prior to the multiplication. In an advantageous hardware implementation, a plurality of identically functioning pre-normalizers is replaced by a single unit which alternates between samples from different subbands in a time-division fashion.

Further embodiments of the present invention will become apparent to a person skilled in the art after reading the description above. Even though the present description and drawings disclose embodiments and examples, the invention is not restricted to these specific examples. Numerous modifications and variations can be made without departing from the scope of the present invention, which is defined by the accompanying claims.

The systems and methods disclosed hereinabove may be implemented as software, firmware, hardware or a combination thereof. Certain components or all components may be implemented as software executed by a digital signal processor or microprocessor, or be implemented as hardware or as an application-specific integrated circuit. Such software may be distributed on computer readable media, which may comprise computer storage media (or non-transitory media) and communication media (or transitory media). As is well known to a person skilled in the art, computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. Further, it is well known to the skilled person that communication media typically embodies computer readable instructions, data structures, program modules or other data in a modulated data signal such as a carrier wave or other transport mechanism and includes any information delivery media.

What is claimed is:

1. A system configured to generate a time stretched and/or frequency transposed signal from an input signal, the system comprising one or more processing elements that:
   derive a number Y≥1 of analysis subband signals from the input signal, wherein each analysis subband signal comprises a plurality of complex-valued analysis samples, each having a phase and a magnitude;
   generate a synthesis subband signal from the Y analysis subband signals using a subband transposition factor Q and a subband stretch factor S, at least one of Q and S being greater than one by:
      forming Y frames of L input samples, each frame being extracted from said plurality of complex-valued analysis samples in an analysis subband signal, wherein L is a frame length greater than 1, and wherein at least one of the L input samples is derived by interpolating two or more of the plurality of complex-valued analysis samples;

applying a block hop size of h samples to said plurality of complex-valued analysis samples, prior to forming a subsequent frame of L input samples, thereby generating a sequence of frames of input samples;

generating, on the basis of Y corresponding frames of input samples, a frame of processed samples by determining a phase and magnitude for each processed sample of the frame, wherein, for at least one processed sample:
  i) the phase of the processed sample is based on the respective phases of corresponding input samples in each of the Y frames of input samples; and
  ii) the magnitude of the processed sample is determined as a mean value of the magnitude of the corresponding input sample in a first frame of the Y frames of input samples and the magnitude of the corresponding input sample in a second frame of the Y frames of input samples;

applying a window function to the frame of processed samples, wherein the window function is a rectangular window with a length corresponding to the frame length L; and determining the synthesis subband signal by overlapping and adding the samples of a sequence of windowed frames of processed samples;

and generating the time stretched and/or frequency transposed signal from the synthesis subband signal, wherein the system is operable at least for Y=2.

2. A method for generating a time stretched and/or frequency transposed signal from an input signal, the method comprising:

deriving a number Y≥2 of analysis subband signals from the input signal, wherein each analysis subband signal comprises a plurality of complex-valued analysis samples, each having a phase and a magnitude;

forming Y frames of L input samples, each frame being extracted from said plurality of complex-valued analysis samples in an analysis subband signal, wherein L is a frame length greater than 1, and wherein at least one of the L input samples is derived by interpolating two or more of the plurality of complex-valued analysis samples;

applying a block hop size of h samples to said plurality of complex-valued analysis samples, prior to deriving a subsequent frame of L input samples, thereby generating a sequence of frames of input samples;

generating, on the basis of Y corresponding frames of input samples, a frame of processed samples by determining a phase and a magnitude for each processed sample of the frame, wherein, for at least one processed sample:
  i) the phase of the processed sample is based on the respective phases of corresponding input samples in each of the Y frames of input samples; and
  ii) the magnitude of the processed sample is determined as a mean value of the magnitude of the corresponding input sample in a first frame of the Y frames of input samples and the magnitude of the corresponding input sample in a second frame of the Y frames of input samples;

determining the synthesis subband signal by applying a window function to the frame of processed samples, and overlapping and adding the samples of a sequence of windowed frames of processed samples, wherein the window function is a rectangular window with a length corresponding to the frame length L; and generating the time stretched and/or frequency transposed signal from the synthesis subband signal.

3. A non-transitory data carrier storing computer-readable instructions for performing the method set forth in claim 2.

\* \* \* \* \*